United States Patent
Roberts et al.

(10) Patent No.: US 6,486,018 B2
(45) Date of Patent: *Nov. 26, 2002

(54) METHODS OF ELECTRICALLY CONTACTING TO CONDUCTIVE PLUGS, METHODS OF FORMING CONTACT OPENINGS, AND METHODS OF FORMING DYNAMIC RANDOM ACCESS MEMORY CIRCUITRY

(75) Inventors: Martin Ceredig Roberts, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/791,229

(22) Filed: Feb. 22, 2001

(65) Prior Publication Data

US 2001/0012657 A1 Aug. 9, 2001

Related U.S. Application Data

(63) Continuation of application No. 09/076,324, filed on May 11, 1998, now Pat. No. 6,221,711.

(51) Int. Cl.[7] ............................................. H01L 21/8242
(52) U.S. Cl. ....................... 438/239; 438/253; 438/256; 438/396; 438/399
(58) Field of Search ................................. 438/210, 239, 438/253, 254, 255, 256, 396, 397, 398, 399

(56) References Cited

U.S. PATENT DOCUMENTS

| | | |
|---|---|---|
| 5,279,989 A | 1/1994 | Kim |
| 5,292,677 A | 3/1994 | Dennison |
| 5,296,400 A | 3/1994 | Park et al. |
| 5,338,700 A | 8/1994 | Dennison et al. |
| 5,346,847 A | 9/1994 | Jun |
| 5,362,666 A | 11/1994 | Dennison |
| 5,378,654 A | 1/1995 | Hsue |
| 5,401,681 A | 3/1995 | Dennison |
| 5,498,562 A | 3/1996 | Dennison et al. |
| 5,538,592 A | 7/1996 | Chen et al. |

(List continued on next page.)

FOREIGN PATENT DOCUMENTS

JP          10341005          12/1998

*Primary Examiner*—Stephen D. Meier
*Assistant Examiner*—Toniae M. Thomas
(74) *Attorney, Agent, or Firm*—Wells St. John P.S.

(57) ABSTRACT

Methods of electrically contacting to conductive plugs, methods of forming contact openings, and methods of forming dynamic random access memory circuitry are described. In one embodiment, a pair of conductive contact plugs are formed to project outwardly relative to a semiconductor wafer. The plugs have respective tops, one of which being covered with different first and second insulating materials. An opening is etched through one of the first and second insulating materials to expose only one of the tops of the pair of plugs. Electrically conductive material is formed within the opening and in electrical connection with the one plug. In a preferred embodiment, two-spaced apart conductive lines are formed over a substrate and conductive plugs are formed between, and on each side of the conductive lines. The conductive plug formed between the conductive lines provides a bit line contact plug having an at least partially exposed top portion. The exposed top portion is encapsulated with a first insulating material. A layer of second different insulating material is formed over the substrate. Portions of the second insulating material are removed selectively relative to the first insulating material over the conductive plugs on each side of the conductive lines to provide a pair of capacitor containers. Capacitors are subsequently formed in the containers.

40 Claims, 8 Drawing Sheets

U.S. PATENT DOCUMENTS

| | | |
|---|---|---|
| 5,569,948 A | 10/1996 | Kim |
| 5,597,763 A | 1/1997 | Sim |
| 5,622,883 A | 4/1997 | Kim |
| 5,651,855 A | 7/1997 | Dennison et al. |
| 5,670,404 A | 9/1997 | Dai |
| 5,688,713 A | 11/1997 | Linliu et al. |
| 5,706,164 A | 1/1998 | Jeng |
| 5,710,073 A | 1/1998 | Jeng et al. |
| 5,721,154 A | 2/1998 | Jeng |
| 5,789,289 A | 8/1998 | Jeng |
| 5,895,239 A | 4/1999 | Jeng et al. |
| 5,904,521 A | 5/1999 | Jeng et al. |
| 5,936,272 A | 8/1999 | Lee |
| 5,989,953 A | 11/1999 | Liang et al. |
| 6,025,247 A | 2/2000 | Chang et al. |
| 6,037,216 A | 3/2000 | Liu et al. |
| 6,060,351 A | 5/2000 | Parekh et al. |
| 6,080,620 A | 6/2000 | Jeng |
| 6,136,643 A | 10/2000 | Jeng et al. |
| 6,136,716 A | 10/2000 | Tu |
| 6,150,213 A | 11/2000 | Luo et al. |

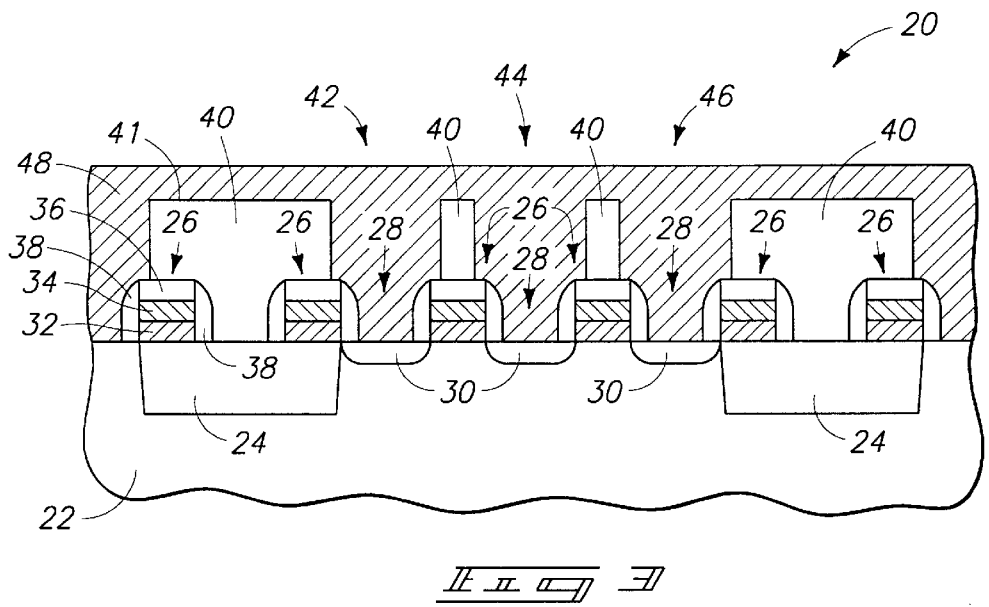
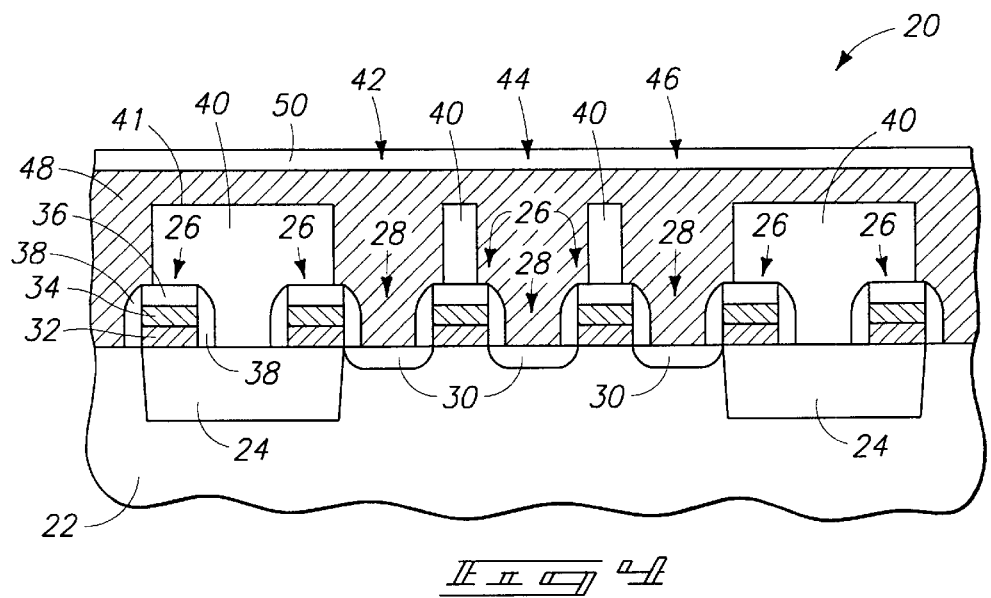

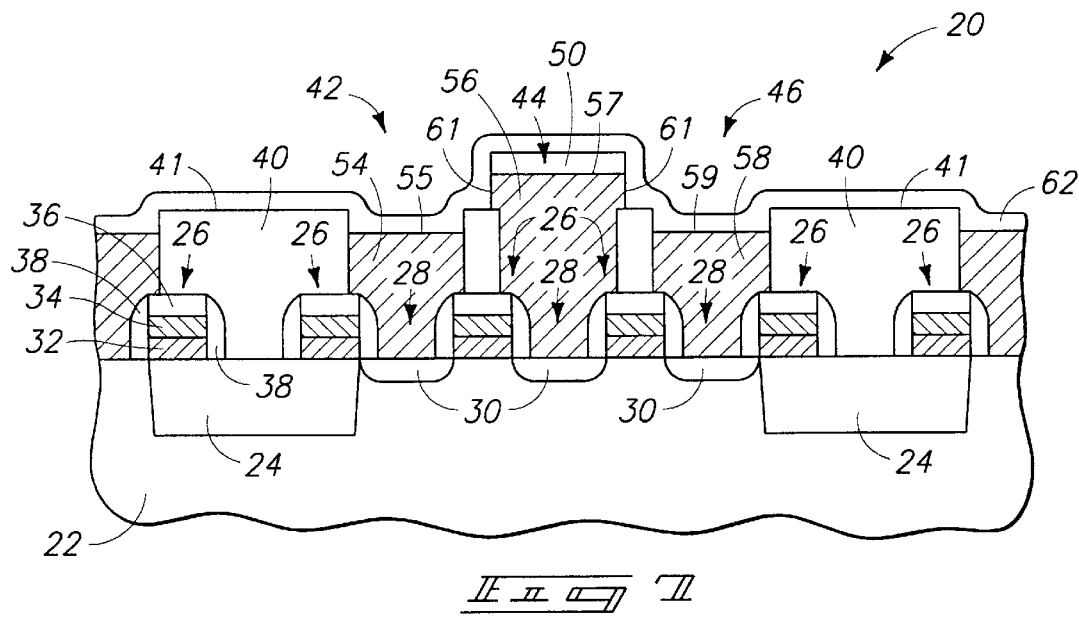
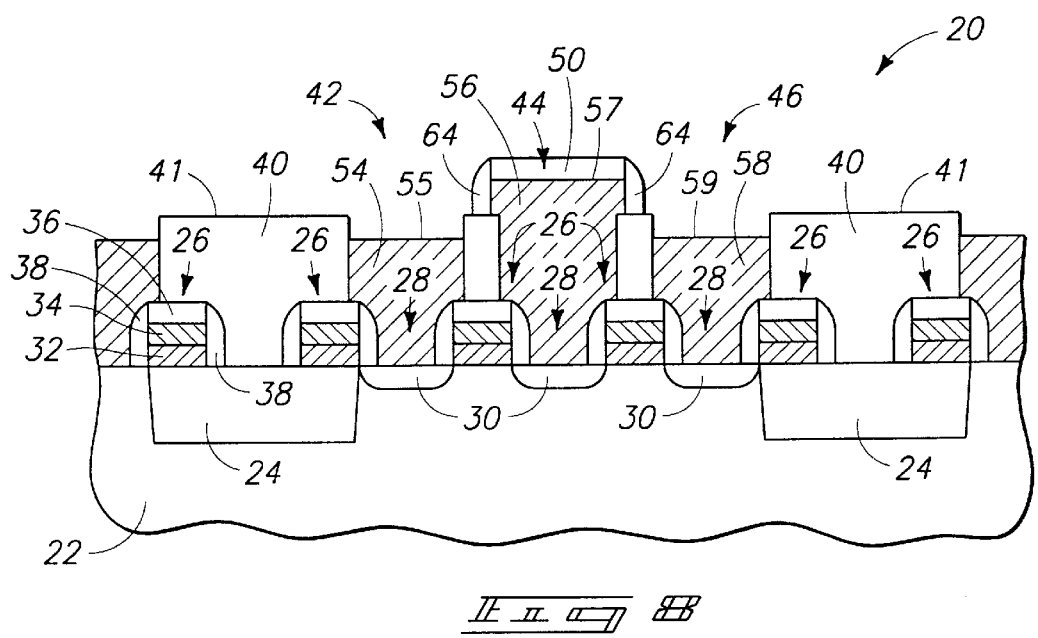

METHODS OF ELECTRICALLY CONTACTING TO CONDUCTIVE PLUGS, METHODS OF FORMING CONTACT OPENINGS, AND METHODS OF FORMING DYNAMIC RANDOM ACCESS MEMORY CIRCUITRY

RELATED PATENT DATA

This patent resulted from a Continuation Application of U.S. patent application Ser. No. 09/076,324, now U.S. Pat. No. 6,221,711, which was filed on May 11, 1998.

TECHNICAL FIELD

This invention relates to methods of electrically contacting to conductive plugs, to methods of forming contact openings, and to methods of forming dynamic random access memory circuitry.

BACKGROUND OF THE INVENTION

As circuit densities increase in semiconductor devices, the probabilities of individual device components becoming grounded to other device components increases as well. In the context of memory circuitry, and in particular dynamic random access memory circuitry, a continuing emphasis is placed upon maximizing the number of memory cells which are formed over a wafer. Balanced against the concerns for maximizing efficient use of wafer real estate, are concerns associated with providing storage capacitors with desirably high storage capabilities.

This invention arose out of concerns associated with improving the usage of wafer real estate during formation of integrated circuitry. In particular, this invention arose out of concerns associated with providing improved methods of forming dynamic random access memory circuitry.

SUMMARY OF THE INVENTION

Methods of electrically contacting to conductive plugs, methods of forming contact openings, and methods of forming dynamic random access memory circuitry are described. In one embodiment, a pair of conductive contact plugs are formed to project outwardly relative to a semiconductor wafer. The plugs have respective tops, one of which is covered with different first and second insulating materials. An opening is etched through one of the first and second insulating materials to expose only one of the tops of the pair of plugs. Electrically conductive material is formed within the opening and in electrical connection with the one plug. In a preferred embodiment, two-spaced apart conductive lines are formed over a substrate and conductive plugs are formed between, and on each side of the conductive lines. The conductive plug formed between the conductive lines provides a bit line contact plug having an at least partially exposed top portion. The exposed top portion is encapsulated with a first insulating material. A layer of second different insulating material is formed over the substrate. Portions of the second insulating material are removed selectively relative to the first insulating material over the conductive plugs on each side of the conductive lines to provide a pair of capacitor containers. Capacitors are subsequently formed in the containers.

BRIEF DESCRIPTION OF THE DRAWINGS

Preferred embodiments of the invention are described below with reference to the following accompanying drawings.

FIG. 3 is a view of the FIG. 1 wafer fragment at a processing step which is subsequent to that shown in FIG. 2.

FIG. 4 is a view of the FIG. 1 wafer fragment at a processing step which is subsequent to that shown in FIG. 3.

FIG. 7 is a view of the FIG. 1 wafer fragment at a processing step which is subsequent to that shown in FIG. 6.

FIG. 8 is a view of the FIG. 1 wafer fragment at a processing step which is subsequent to that shown in FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
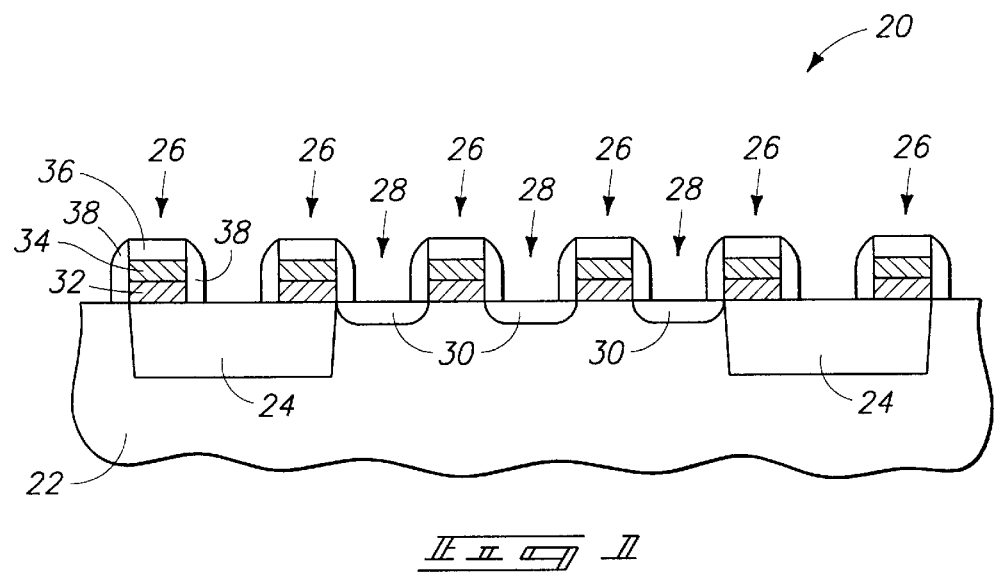
FIG. 1 is a diagrammatic side sectional view of a semiconductor wafer fragment in process in accordance with one embodiment of the invention.

Referring to FIG. 1, a semiconductor wafer fragment 20 in process comprises a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A pair of isolation oxide regions 24 are provided and can be formed through conventional techniques such as shallow trench isolation techniques. A plurality of spaced-apart conductive lines 26 are formed over substrate 22. Between the conductive lines, three substrate node locations 28 are defined with which electrical communication is desired and preferably comprise diffusion regions 30. Individual conductive lines include a polysilicon layer 32, an overlying silicide layer 34, and an insulative cap 36. Sidewall spacers 38 are provided over the sidewalls of lines 26.

Figure 2:
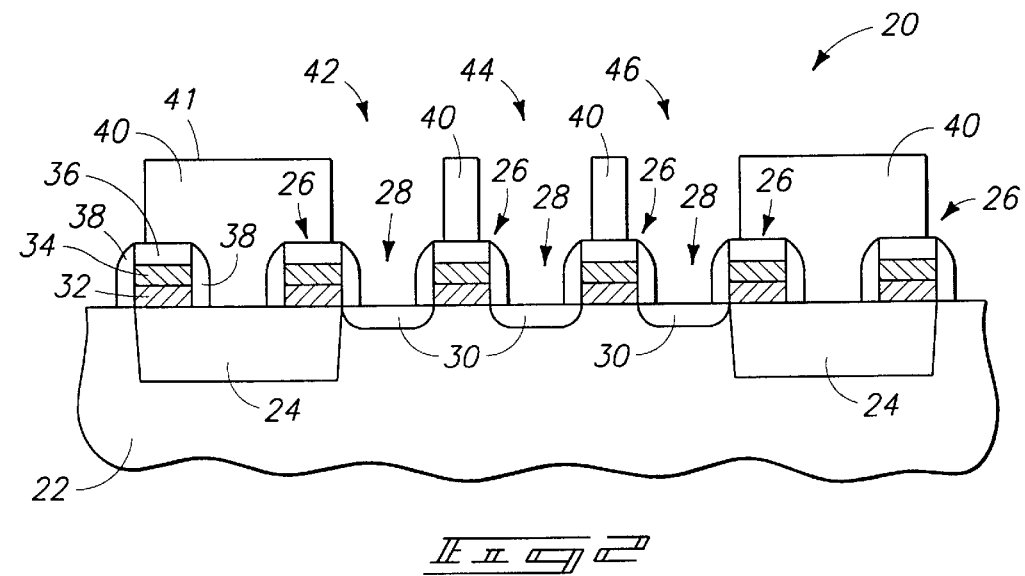
FIG. 2 is a view of the FIG. 1 wafer fragment at a processing step subsequent to that which is shown in FIG. 1.

Referring to FIG. 2, an insulative material layer 40 is formed over substrate 22, and is subsequently patterned and etched to form openings 42, 44, and 46 over node locations 28. The insulative layer has an uppermost surface 41. An exemplary material for layer 40 is borophosphosilicate glass (BPSG).

Referring to FIG. 3, an electrically conductive material layer 48 is formed over substrate 22 and individual node locations 28. An exemplary material is polysilicon.

Referring to FIG. 4, a first deposition step deposits a first insulating material layer 50 over substrate 22 and conductive material 48. For purposes of the ongoing discussion, layer 50 comprises a first encapsulating material. An exemplary material is silicon nitride ($Si_3N_4$).

Figure 5:
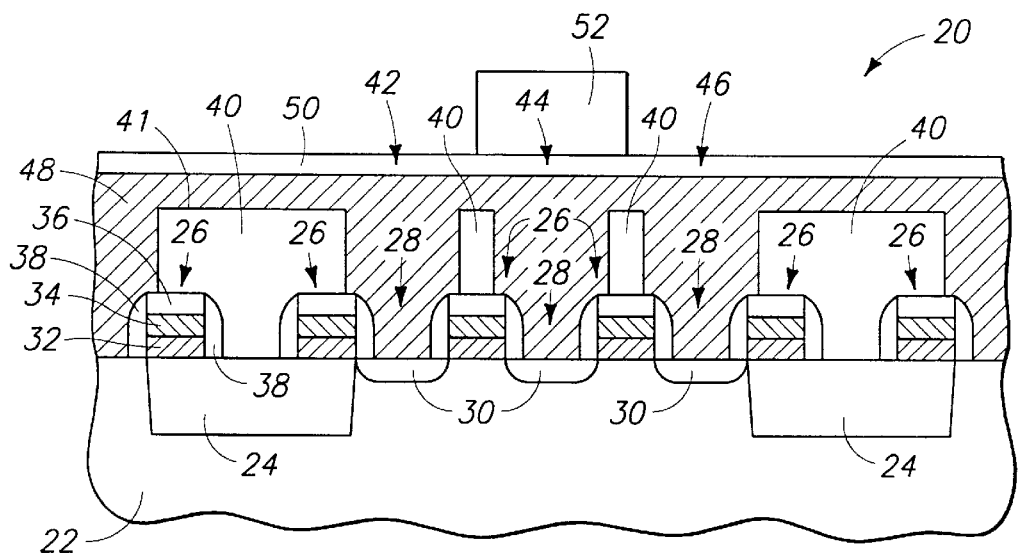
FIG. 5 is a view of the FIG. 1 wafer fragment at a processing step which is subsequent to that shown in FIG. 4.

Referring to FIG. 5, a patterned plug masking layer 52 is formed over substrate 22 and node locations 28. Layer 52 masks over the centermost node location 28. An exemplary material is photoresist.

Figure 6:
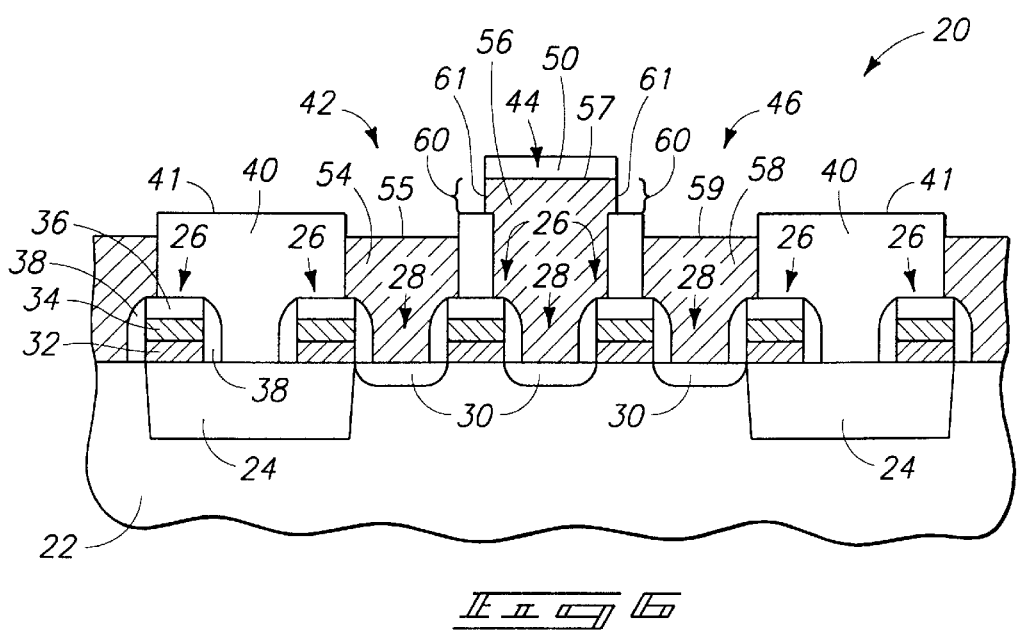
FIG. 6 is a view of the FIG. 1 wafer fragment at a processing step which is subsequent to that shown in FIG. 5.

Referring to FIG. 6, material of first layer 50 and conductive material 48 is etched sufficiently to form electrically isolated conductive plugs 54, 56, and 58 within openings 42, 44, and 46 respectively. Plug 56 constitutes a furthermost projecting plug of the illustrated conductive plugs. Material of layer 50 is disposed only on the top of conductive plug 56. Plugs 54 and 58 are formed by etching material laterally adjacent furthestmost projecting plug 56. Such etching exposes a plug portion 60 of plug 56. Such etching can be conducted using at least two different etching chemistries to effect the etching. Where layer 40 comprises BPSG, layer 48 comprises polysilicon, and layer 50 comprises silicon nitride, suitable etch conditions are, for the nitride etch, $CF_4$, He, and $CH_2F_2$ at respective flow rates of 25 sccm, 150 sccm, and 30 sccm. For the polysilicon etch, $Cl_2$, $CF_4$ at respective flow rates of 75 sccm, and 25 sccm. For a polysilicon overetch, $Cl_2$, $HeO_2$, and HBr at respective flow rates of 40 sccm, 8 sccm, and 160 sccm. In this example, conductive material within opening 44 is not etched, while some of the conductive material within openings 42, 46 is etched to recess it below uppermost surface 41 of insulative layer 40.

The conductive plugs project away or outwardly from substrate 22 and terminate proximate respective conductive plug tops 55, 57, and 59. Plugs 54 and 56 comprise a pair of first and second plugs which project away from a substrate different distances; and plugs 56, 58 comprise a different pair of first and second plugs which project away from the substrate different distances. Accordingly, plug tops 55, 57 and plug tops 57, 59 are formed at different elevations. Accordingly, some of the conductive plugs are formed elevationally below other conductive plugs.

In a preferred embodiment, and in the context of dynamic random access memory, the above-described plug formation constitutes forming conductive plugs between, and on each side of the conductive lines away from the conductive plug formed between the conductive lines. Conductive plug 56 provides a bit line contact plug having an at least partially exposed top portion 60. Top portion 60 is defined at least in part by sidewalls 61. Exposed top portion 60 joins with top 57 which defines a plug terminus.

Referring to FIG. 7, a first insulating material layer 62 is formed over the substrate and entirely covers or encapsulates exposed plug portion 60. Layer 62 constitutes a second layer of the first encapsulating material which is formed over plug portion 60. The forming of layer 62 constitutes a second first material deposition step. Layer 62 is formed over previously-formed first insulating material 50.

Referring to FIG. 8, layer 62 is anisotropically etched to form sidewall spacers 64 over sidewalls 61. Accordingly, one of the conductive plugs is electrically insulated or encapsulated, while at least portions of the tops of the other conductive plugs are left outwardly exposed.

Figure 9:
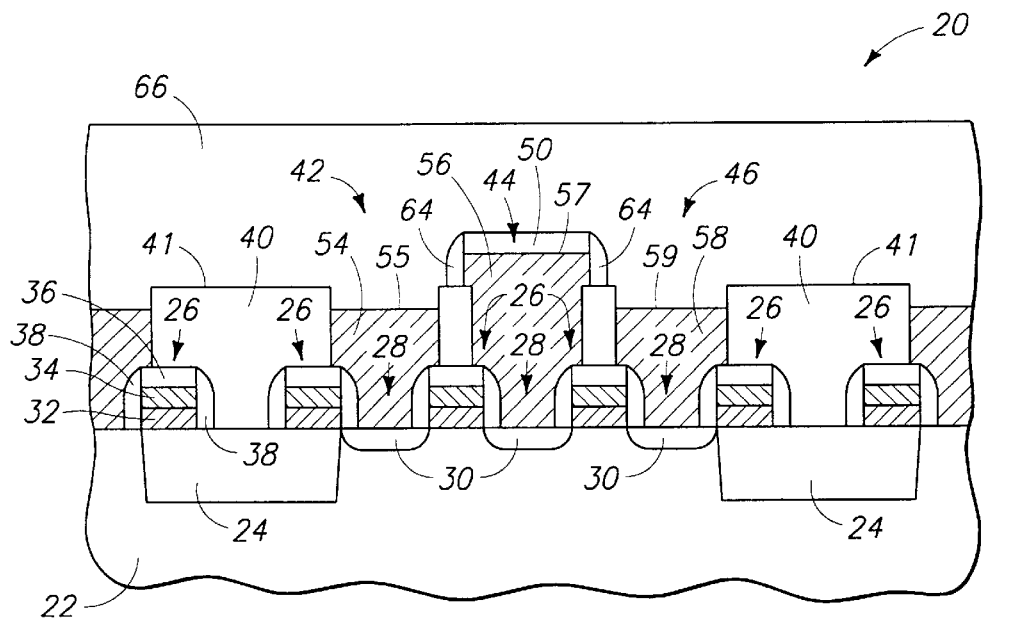
FIG. 9 is a view of the FIG. 1 wafer fragment at a processing step which is subsequent to that shown in FIG. 8.

Referring to FIG. 9, a second insulating material layer 66 is formed over substrate 22 and is preferably different from the first insulating material. An exemplary material for layer 66 is an oxide material such as borophosphosilicate glass (BPSG). Plug top 57 of conductive plug 56 is accordingly covered with different insulating materials, e.g. the first and the second insulating materials. Plugs 54, 58 do not have their respective tops covered with both first and second insulating material.

Figure 10:
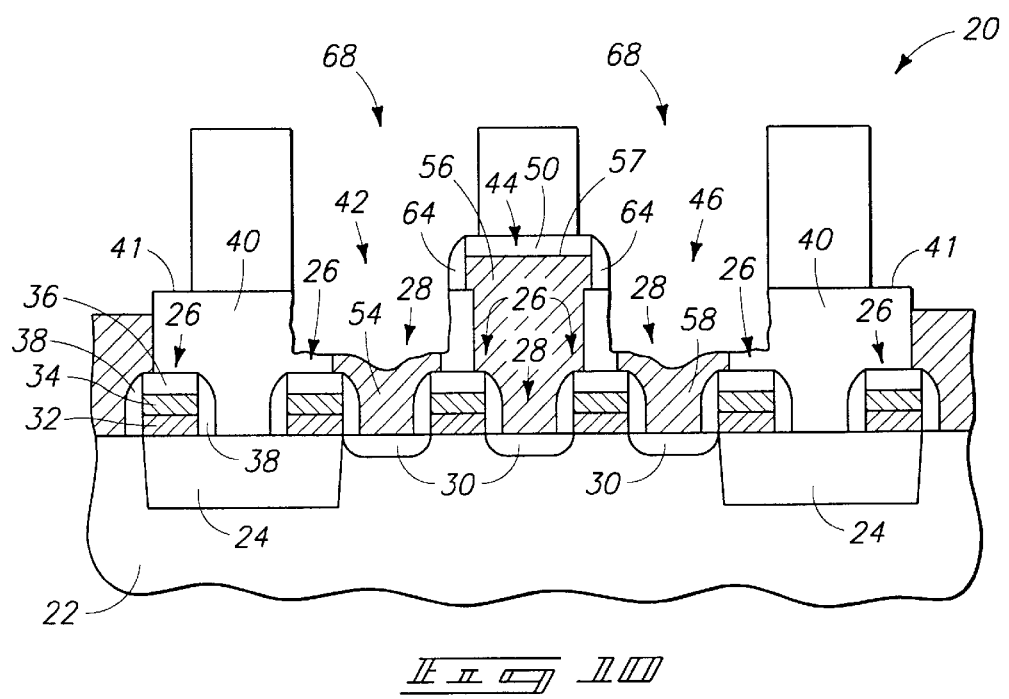
FIG. 10 is a view of the FIG. 1 wafer fragment at a processing step which is subsequent to that shown in FIG. 9.

Referring to FIG. 10, openings 68 are etched through second insulating material 66 to expose the tops of plugs 54, 58. In the illustrated example, conductive material comprising plugs 54, 58 is also removed. The etching of openings 68 preferably does not etch any of the material comprising conductive plug 56 because layer 66 is selectively etched or removed relative to the first material comprising sidewall spacers 64 and insulating material 50. Accordingly, openings 68 are self-aligned relative to plug 56. Exemplary self-aligned contact processing is described in U.S. Pat. Nos. 5,651,855, 5,670,404, 5,597,763, and 5,378,654, which are incorporated by reference.

The etching of layer 66 removes selected portions of the second insulating material and provides a pair of capacitor containers over the non-furthestmost projecting conductive plugs.

Figure 11:
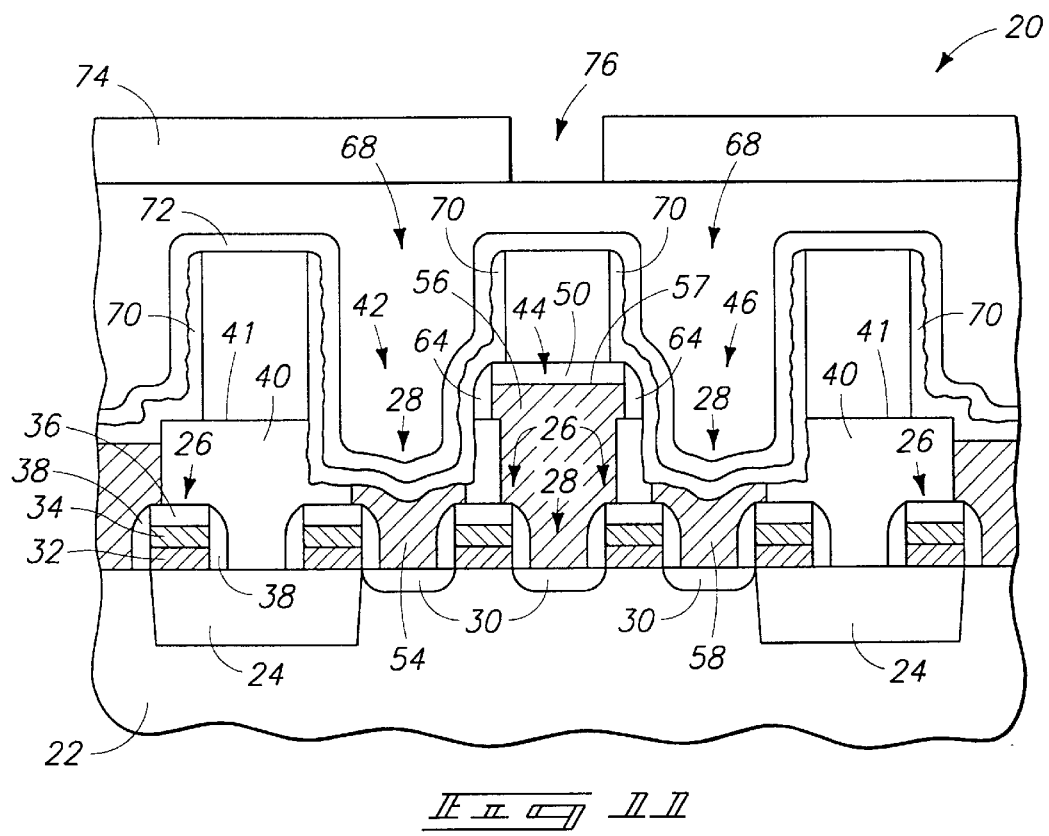
FIG. 11 is a view of the FIG. 1 wafer fragment at a processing step which is subsequent to that shown in FIG. 10.

Referring to FIG. 11, electrically conductive material is formed within each of openings 68 and in electrical connection with plugs 54, 58 respectively. In the illustrated example, the conductive material includes a storage node layer 70 which can comprise roughened polysilicon such as hemispherical grain (HSG) polysilicon or cylindrical grain (CSG) polysilicon. A dielectric layer (not specifically designated) is formed over storage node layer 70, with a cell plate layer 72 being formed thereover to provide storage capacitors within capacitor containers 68. A patterned masking layer 74 is formed over substrate 22 and provides an opening 76 through which a bit line contact is to be formed.

Figure 12:
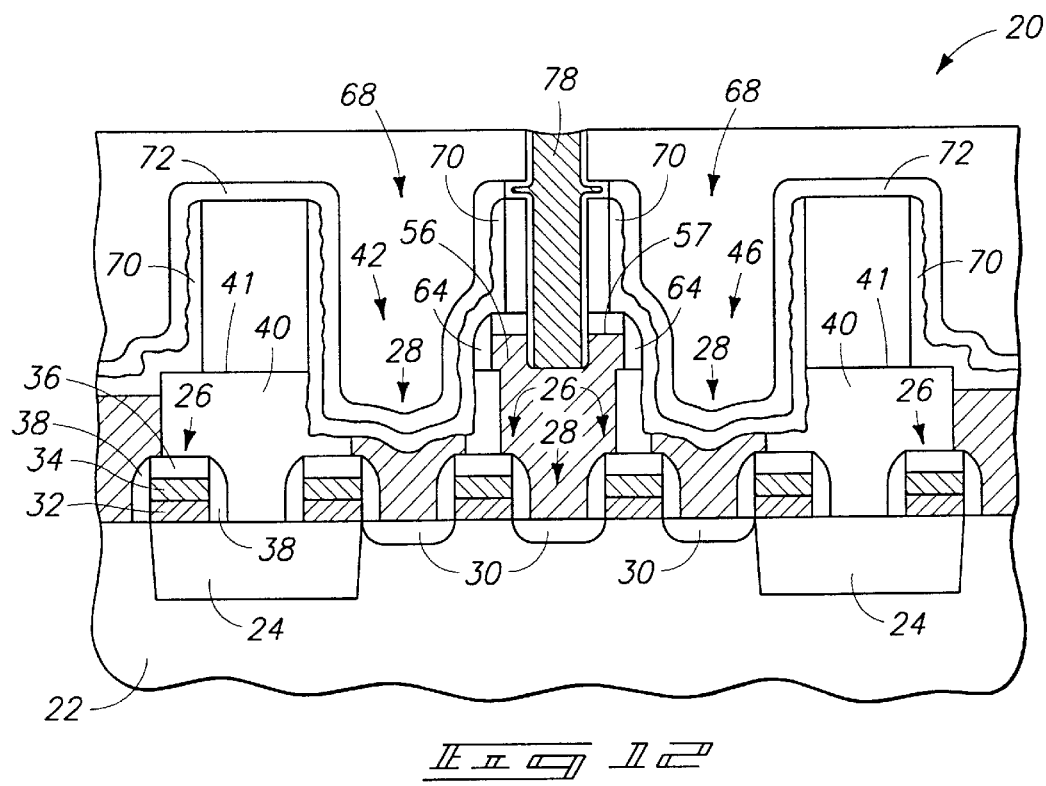
FIG. 12 is a view of the FIG. 1 wafer fragment at a processing step which is subsequent to that shown in FIG. 11.

Referring to FIG. 12, a self-aligned penetrating contact is formed into conductive plug 56 to provide a bit line contact 78. Exemplary processing methods of forming bit line contact 78 are described in U.S. Pat. Nos. 5,362,666, 5,498, 562, 5,338,700, mand 5,292,677, which are incorporated by reference.

Figure 13:
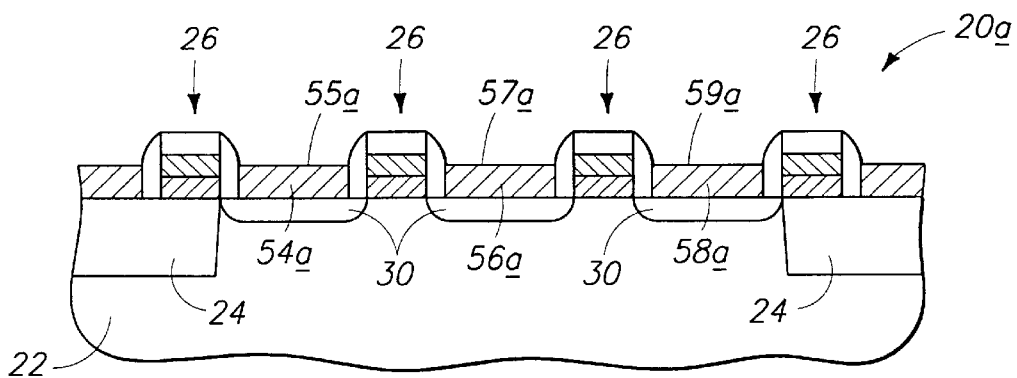
FIG. 13 is a diagrammatic side sectional view of a semiconductor wafer fragment in process, in accordance with another embodiment of the invention.

Referring to FIG. 13, a semiconductor wafer fragment 20*a* in accordance with another embodiment of the present invention comprises a semiconductive substrate 22. Like numerals from the above-described embodiment are utilized where appropriate, with differences being indicated by the suffix "a". Conductive plugs 54*a*, 56*a*, and 58*a* are provided over substrate 22 and include respective tops 55*a*, 57*a*, and 59*a* which are formed proximate a substantially common elevation.

Figure 14:
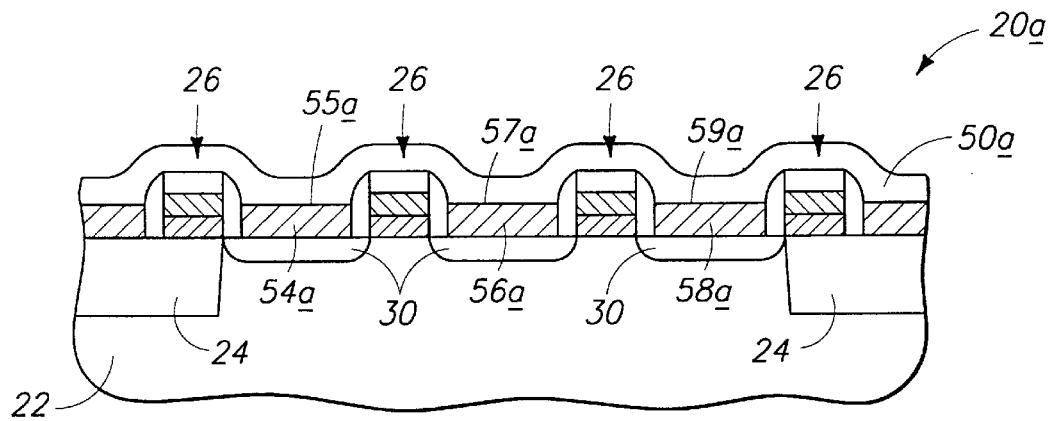
FIG. 14 is a view of the FIG. 13 wafer fragment at a processing step which is subsequent to that shown in FIG. 13.

Referring to FIG. 14, a first insulating material layer 50*a* is formed over substrate 22.

Figure 15:
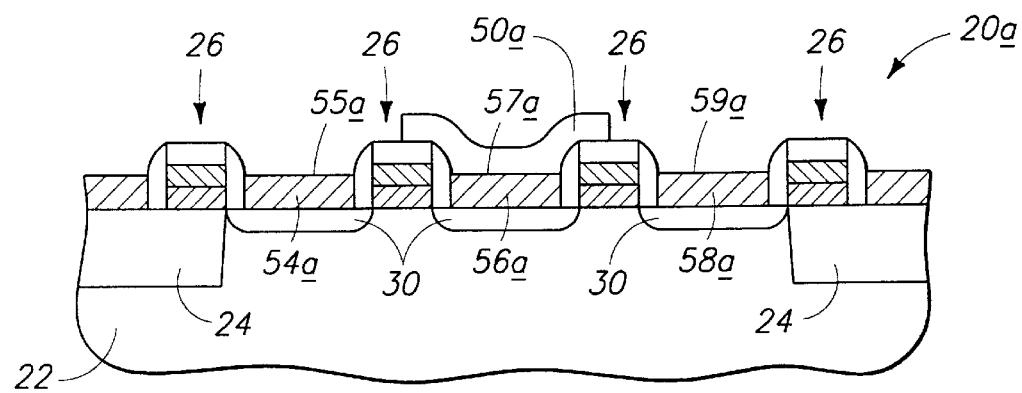
FIG. 15 is a view of the FIG. 13 wafer fragment at a processing step which is subsequent to that shown in FIG. 14.

Referring to FIG. 15, layer 50*a* is patterned and etched over conductive plug 56*a*.

Figure 16:
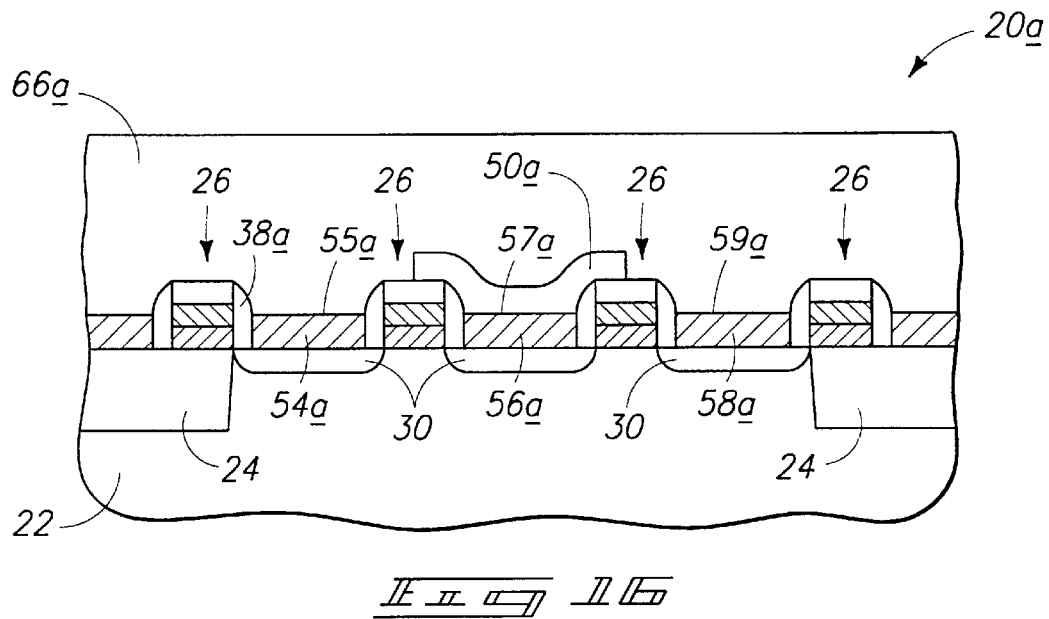
FIG. 16 is a view of the FIG. 13 wafer fragment at a processing step which is subsequent to that shown in FIG. 15.

Referring to FIG. 16, a second insulating material layer 66a is formed over the substrate.

Figure 17:
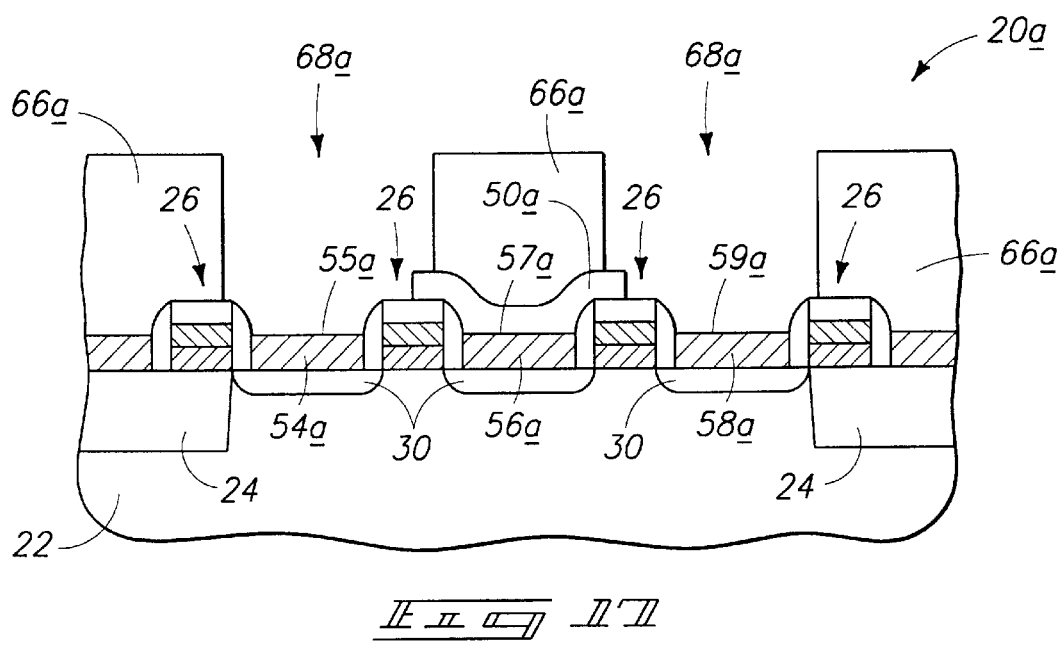
FIG. 17 is a view of the FIG. 13 wafer fragment at a processing step which is subsequent to that shown in FIG. 16.

Referring to FIG. 17, layer 66a is patterned and preferably selectively etched anisotropically relative to layer 50a to form openings 68a over conductive plugs 54a and 58a respectively. Further processing can now take place in accordance with the methods described above.

The inventive methods permit integrated circuitry to be formed having improved densities with less risk of undesirable device grounding/shorting. In the context of memory circuitry, the inventive methods permit reductions in container cell size by reducing, if not eliminating altogether, the chances of a capacitor shorting to a bit line contact plug. Other advantages of the present invention will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrical contact opening to one of a pair of adjacent conductive plugs separated by intervening insulative material, comprising:
   forming a pair of conductive contact plugs projecting outwardly relative to a semiconductor wafer, the plugs having respective tops covered with different first and second insulating materials; and
   etching an opening through one of the first and second insulating materials to expose only one of the tops of the pair of plugs.

2. The method of claim 1, wherein the etching of the opening comprises selectively etching the one of the first and second insulating materials relative to the other of the first and second insulating materials.

3. The method of claim 1, wherein the other of the plugs has its top covered with both the first and the second insulating materials.

4. The method of claim 1, wherein the one of the first and second insulating materials comprises an oxide material, and the other of the first and second insulating materials comprises a nitride material.

5. The method of claim 1, wherein the forming of the conductive contact plugs comprises forming the respective tops of the plugs proximate a common elevation.

6. The method of claim 1, wherein the forming of the conductive contact plugs comprises forming the respective tops of the plugs at different elevations.

7. The method of claim 6, wherein the forming of the conductive contact plugs comprises forming the one plug elevationally below the other plug.

8. A method of forming a contact opening comprising:
   electrically insulating one of first and second conductive plugs formed over a substrate with material comprising a first material, the plugs having respective plug tops formed above the substrate, while leaving at least a portion of the top of the other of the plugs outwardly exposed;
   forming a second material over both of the plug tops, the second material being different from the first material; and
   selectively removing second material over the other of the plugs relative to the first material sufficiently to form a contact opening thereover.

9. The method of claim 8, further comprising, prior to electrically insulating, forming the plugs to have plug tops at different elevations.

10. The method of claim 8, further comprising, prior to electrically insulating, forming the plugs to have plug tops proximate common elevations.

11. The method of claim 8, further comprising, prior to electrically insulating, forming the one plug to have sidewalls joined with its top, and the electrically insulating comprises forming sidewall spacers over the sidewalls of the one plug.

12. The method of claim 11, further comprising, prior to electrically insulating, forming the top of the one plug to be disposed elevationally higher than the top of the other plug.

13. The method of claim 8, wherein the electrically insulating the one plug comprises conducting two separate first material deposition steps.

14. The method of claim 13, wherein a first of the two steps comprises depositing first material only on the top of the one plug.

15. A method of forming a contact opening comprising:
   forming a conductive plug over each of a pair of node locations on a substrate, the conductive plugs projecting away from the substrate different distances and terminating proximate respective conductive plug tops;
   encapsulating a furthestmost projecting of the two conductive plugs with a first encapsulating material, the encapsulating covering the furthermost projecting conductive plug top and a plug portion proximate the top with first encapsulating material;
   forming a second material which is different from the first material over the substrate including the two projecting plugs; and
   selectively etching the second material relative to the first material sufficiently to form a contact opening over and expose the non-furthermost projecting of the two conductive plugs.

16. The method of claim 15, wherein forming a conductive plug over each of a pair of node locations comprises forming a conductive plug over each of a pair of diffusion regions.

17. The method of claim 15, wherein the encapsulating comprises forming the first encapsulating material over the furthermost projecting conductive plug in two separate steps.

18. The method of claim 15, wherein the encapsulating comprises:
   forming a first layer of the first encapsulating material over the substrate and node locations;
   etching the first layer and material laterally adjacent the furthestmost projecting plug sufficiently to expose said plug portion; and
   forming a second layer of the first encapsulating material over the plug portion.

19. The method of claim 18, wherein the etching of the first layer and material comprises using at least two different etching chemistries to effect the etching.

20. The method of claim 19 further comprising prior to the etching of the first layer and material, forming a patterned plug masking layer over the first layer.

21. The method of claim 18, further comprising anisotropically etching the second layer of the first encapsulating material to provide sidewall spacers over the plug portions.

22. A method of forming dynamic random access memory circuitry comprising:

forming conductive plugs between, and on each side of two conductive lines formed on a substrate, the plugs formed on each side being formed away from the conductive plug formed between the lines, the conductive plug formed between the conductive lines providing a bit line contact plug having an at least partially exposed top portion;

encapsulating the at least partially exposed top portion with a first insulating material; and forming a layer of second insulating material over the substrate, the second insulating material being different from the first insulating material.

23. The method of claim 22, wherein the exposed top portion is defined at least in part by a sidewall, and the encapsulating comprises:

forming a layer of first insulating material over the substrate and sidewall; and etching the layer sufficiently to form a sidewall spacer over the sidewall.

24. The method of claim 22, wherein the forming of the conductive plugs comprises forming said plugs to have respective tops which are disposed at a substantially common elevation.

25. The method of claim 22, wherein the exposed top portion joins with a top defining a plug terminus, and the forming of the conductive plugs on said each side of the conductive lines comprises forming said conductive plugs to be elevationally below the top.

26. The method of claim 22, wherein the encapsulating comprises forming said first insulative material over a previously-formed layer of first insulative material disposed over the top portion.

27. A method of forming dynamic random access memory circuitry comprising:

forming an insulative layer of material over two spaced-apart conductive lines formed over a substrate, the conductive lines defining three substrate node locations;

forming openings through the insulative layer over the three substrate node locations;

forming electrically conductive material over the individual node locations and electrically isolated within the openings, the conductive material projecting away from the substrate, conductive material within one of the openings having a portion which is outwardly exposed;

forming a first insulating material over and entirely covering the conductive material outwardly exposed portion;

forming a second insulating material over the first insulating material which is different from the first material;

selectively etching the second insulating material relative to the first insulating material sufficiently to form capacitor containers over and to expose conductive material not within the one opening; and forming capacitors received by the capacitor containers.

28. The method of claim 27, wherein the forming of the electrically conductive material comprises:

forming a patterned masking layer over the node locations; and etching the conductive material sufficiently to electrically isolate the conductive material within the openings.

29. The method of claim 28, wherein the etching of the conductive material comprises not etching conductive material within the one opening.

30. The method of claim 28, wherein the etching of the conductive material comprises recessing the conductive material to below an uppermost surface of the insulative layer within openings other than the one opening.

31. The method of claim 28, wherein the forming of the first insulating material and the covering of the conductive material exposed portion comprises forming a first insulating material layer over the substrate and anisotropically etching the first insulating material layer.

32. The method of claim 1, further comprising forming an electrically conductive material within the opening in electrical connection with the one plug.

33. The method of claim 22, further comprising removing selected portions of the second insulating material selectively relative to the first insulating material over the conductive plugs on said each side of the conductive lines, the removing providing a pair of capacitor containers.

34. A method of forming a contact opening comprising:

forming first and second conductive polysilicon plugs over a semiconductive substrate, the plugs projecting away from the substrate and toward respective plug tops;

electrically insulating one of the plugs with material comprising a first material, while leaving at least a portion of the top of the other of the plugs outwardly exposed;

forming a second material over both of the plug tops, the second material being different from the first material; and selectively removing second material over the other of the plugs relative to the first material sufficiently to form a contact opening thereover.

35. The method of claim 34, wherein the forming of the first and second conductive plugs comprise forming the plug tops at different elevations.

36. The method of claim 34, wherein the forming of the first and second conductive plugs comprise forming the plug tops proximate common elevations.

37. The method of claim 34, wherein the one plug has sidewalls joined with its top, and the electrically insulating the one plug comprises forming sidewall spacers over the sidewalls.

38. The method of claim 37, wherein the top of the one plug is disposed elevationally higher than the top of the other plug.

39. The method of claim 34, wherein the electrically insulating the one plug comprises conducting two separate first material deposition steps.

40. The method of claim 39, wherein a first of the two steps comprises depositing first material only on the top of the one plug.

* * * * *

UNITED STATES PATENT AND TRADEMARK OFFICE
CERTIFICATE OF CORRECTION

PATENT NO. : 6,486,018 B2  Page 1 of 1
DATED : November 26, 2002
INVENTOR(S) : Martin Ceredig Roberts et al.

It is certified that error appears in the above-identified patent and that said Letters Patent is hereby corrected as shown below:

Column 4,
Line 53, replace "5,338,700, mand 5,292,677, which are incorporated by" with
-- 5,338,700, and 5,292,677, which are incorporated by --

Signed and Sealed this

Twenty-second Day of April, 2003

JAMES E. ROGAN
*Director of the United States Patent and Trademark Office*